United States Patent
Chen et al.

(10) Patent No.: US 10,978,599 B2
(45) Date of Patent: Apr. 13, 2021

(54) METHOD FOR IMPROVING CORROSION RESISTANCE OF GOLD FINGER

(71) Applicants: GUANGZHOU FASTPRINT CIRCUIT TECH CO., LTD, Guangdong (CN); SHENZHEN FASTPRINT CIRCUIT TECH CO., LTD., Guangdong (CN); GUANGZHOU FASTPRINT ELECTRONIC CO., LTD., Guangdong (CN)

(72) Inventors: Liyang Chen, Guangzhou (CN); Shuxiao Qiao, Guangzhou (CN)

(73) Assignees: Guangzhou Fastprint Circuit Tech Co., Ltd., Guangdong (CN); Shenzhen Fastprint Circuit Tech Co., Ltd., Guangdong (CN); Guanazhou Fastorint Electronic Co., Ltd., Guangdong (CN)

( * ) Notice: Subject to any disclaimer, the term of this patent is extended or adjusted under 35 U.S.C. 154(b) by 155 days.

(21) Appl. No.: 16/092,928

(22) PCT Filed: Mar. 31, 2017

(86) PCT No.: PCT/CN2017/078926
§ 371 (c)(1),
(2) Date: Mar. 15, 2019

(87) PCT Pub. No.: WO2017/177832
PCT Pub. Date: Oct. 19, 2017

(65) Prior Publication Data
US 2019/0198692 A1     Jun. 27, 2019

(30) Foreign Application Priority Data

Apr. 11, 2016 (CN) .......................... 201610225878.4

(51) Int. Cl.
| | | |
|---|---|---|
| *H01L 31/02* | (2006.01) | |
| *H01L 31/0224* | (2006.01) | |
| *H01L 31/05* | (2014.01) | |
| *H01L 31/18* | (2006.01) | |

(52) U.S. Cl.
CPC ............. *H01L 31/022433* (2013.01); *H01L 31/02013* (2013.01); *H01L 31/022425* (2013.01); *H01L 31/0512* (2013.01); *H01L 31/186* (2013.01)

(58) Field of Classification Search
CPC ..... H01L 31/021013; H01L 31/022425; H01L 31/022433; H01L 31/0512; H01L 31/186
See application file for complete search history.

(56) References Cited

U.S. PATENT DOCUMENTS

| | | | |
|---|---|---|---|
| 2009/0020320 A1 | 1/2009 | Huang et al. | |
| 2014/0166071 A1* | 6/2014 | Gaynes | H01L 31/0543 136/246 |

FOREIGN PATENT DOCUMENTS

| | | |
|---|---|---|
| CN | 101643927 | 2/2010 |
| CN | 101699940 | 4/2010 |
| (Continued) | | |

OTHER PUBLICATIONS

Second Chinese Office Action for Application No. 201610225878.4 dated Sep. 25, 2018, 8 pages.
(Continued)

*Primary Examiner* — Cheung Lee
(74) *Attorney, Agent, or Firm* — Seyfarth Shaw LLP

(57) ABSTRACT

Provided is a method for improving the corrosion resistance of a gold finger, which is applicable to an electro-optical circuit board including gold fingers, wherein a guide line is arranged at a root portion of the gold fingers of the electro-optical circuit board. The method comprises the following steps in sequence: 1) electrical connection: using an outer
(Continued)

lead to electrically connect all gold fingers of a electro-optical circuit board; 2) solder resistance: performing solder resistance on an area other than the outer lead; 3) gold plating on the gold fingers; 4) etching of the outer lead; and 5) solder resistance: performing solder resistance on a vacancy after etching of the lead. In the method, an outer lead is arranged to electrically connect all gold fingers of a electro-optical circuit board, so that all sides of the gold fingers are plated with gold, thereby significantly improving the corrosion resistance of the gold fingers.

7 Claims, 1 Drawing Sheet

(56) References Cited

FOREIGN PATENT DOCUMENTS

| CN | 102014579 | | 4/2011 |
|----|-----------|---|--------|
| CN | 102014585 | | 4/2011 |
| CN | 102045956 | | 5/2011 |
| CN | 102045957 | | 5/2011 |
| CN | 102045960 | A | 5/2011 |
| CN | 102045963 | A | 5/2011 |
| CN | 102271465 | A | 12/2011 |
| CN | 203435230 | U | 2/2014 |
| CN | 105451454 | | 3/2016 |
| CN | 105813397 | | 7/2016 |

OTHER PUBLICATIONS

PCT Search Report for Application No. PCT/CN2017/078926, dated Jul. 12, 2017, 2 pages.
Chinese Office Action for Application No. 20160225878.4, 5 pages.
Chinese Search Report of CN2016102258784 dated Apr. 11, 2016, 2 pages.
Written Opinion for Application No. PCT/CN2017/078926 dated Jul. 12, 2017, 4 pages.

* cited by examiner

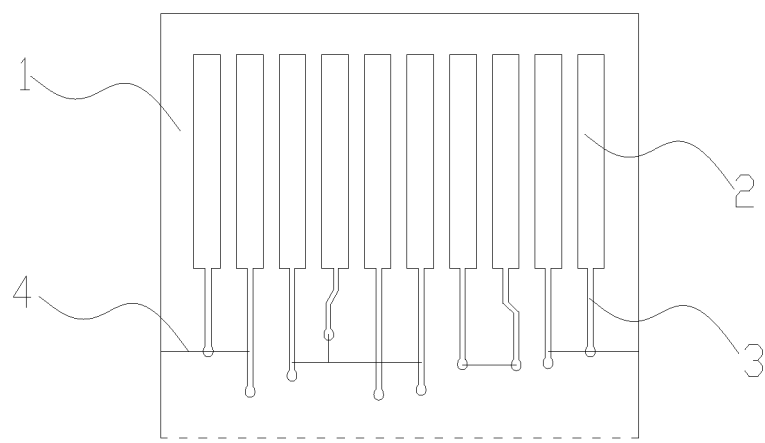

METHOD FOR IMPROVING CORROSION RESISTANCE OF GOLD FINGER

TECHNICAL FIELD

The present disclosure relates to the field of PCB (Printed Circuit Board) processing, and in particular, to a method for improving corrosion resistance of a gold finger.

BACKGROUND

At present, the gold plating of a gold finger of an electro-optical circuit board in the industry is generally performed as follows: making a connection of a lead to a main guide line at the front end of the gold finger, connecting to an edge of the panel to realize electrical connection, and then removing the lead manually or etching the lead by using a wet film. The gold finger obtained is covered with gold in three sides, while copper is exposed at the front end of the gold finger. The reliability of such product is poor, and the gold finger is impossible to pass MFG (Mixed Corrosive Gas) test.

SUMMARY

In order to overcome deficiencies of the prior art, the present disclosure aims at providing a method for improving corrosion resistance of a gold finger.

To solve the above problems, the technical solution adopted by the present disclosure is as follows.

A method for improving corrosion resistance of a gold finger is provided, which is applicable to an electro-optical circuit board including gold fingers, wherein a guide line is arranged at a root of the gold finger of the electro-optical circuit board. The method includes following steps in sequence:
1) electrical connection: electrically connecting all the gold fingers of the electro-optical circuit board by using an outer lead, wherein the outer lead is disposed on both sides of the guide line;
2) soldermask coating: performing soldermask coating on areas outside the outer lead;
3) plating gold on the gold finger;
4) etching the outer lead; and
5) soldermask coating: performing soldermask coating on a vacancy formed after etching the outer lead.

Preferably, plated-through holes are made in an area of the gold fingers of the electro-optical circuit board, and inner leads are disposed in the plated-through holes in the step 1).

Preferably, adjacent gold fingers in the electro-optical circuit board are connected by the outer lead or the inner lead in the step 1).

Preferably, a position of the outer lead is disposed 1-10 mm away from the root of the gold finger in the step 1).

Preferably, the soldermask coating in the step 2) is performed as follows: performing soldermask coating on the electro-optical circuit board, and performing soldermask coating and development in a position of the outer lead to expose the outer lead, so that the outer lead is not covered by a solder mask.

Preferably, an area uncovered by the solder mask is 1 to 10 mils greater than a width of the outer lead in the step 2).

Preferably, the step of plating gold on the gold finger in the step 3) includes:
a) covering a dry film on an outer surface to only expose the area of the gold fingers;
b) plating the gold on the gold finger; and
c) removing the dry film in the step a).

Preferably, hard gold plating is performed with a current density of 3-5ASF in the step 3).

Preferably, the step of etching the outer lead in the step 4) includes:
i) covering the dry film on the outer surface, wherein a position of the outer lead is designed to open a window without being covered by the dry film;
ii) etching the outer lead; and
iii) removing the dry film in the step i).

Compared with the prior art, the present disclosure has the following beneficial effects.

For the method for improving corrosion resistance of a gold finger provided in the present disclosure, all the gold fingers of the electro-optical circuit board are electrically connected by disposing the outer leads, so that the four sides of the gold fingers can be plated with gold, thereby improving the corrosion resistance of the gold fingers. The leads are designed at the two sides of the guide lines, and the leads do not have to be removed at the front end, therefore the deficiency of the remnant leads of the gold fingers can be remedied to improve the quality.

Details of the present disclosure are further presented in following drawings and descriptions.

BRIEF DESCRIPTION OF DRAWINGS

FIG. 1 is a structural view illustrating an electro-optical circuit board after being processed according to step 1) in Embodiment One.

In FIG. 1, reference signs include: 1. electro-optical circuit board; 2. gold finger; 3. guide line; and 4. outer lead.

DETAILED DESCRIPTION OF PREFERRED EMBODIMENTS

A method for improving corrosion resistance of a gold finger is provided in the present disclosure, which is applicable to an electro-optical circuit board including gold fingers. As shown in FIG. 1, a root of a gold finger 2 of an electro-optical circuit board 1 is disposed with a lead 3. The method includes following steps:
1) electrical connection: electrically connecting all the gold fingers of the photovoltaic electro-optical circuit board by using an outer lead 4, wherein the outer lead is disposed on both sides of the guide line;
2) soldermask coating: performing soldermask coating on areas outside the outer lead;
3) plating gold on the gold finger;
4) etching the outer lead; and
5) soldermask coating: performing soldermask coating on a vacancy formed after etching the outer lead.

By using the method, all the gold fingers of the electro-optical circuit board are electrically connected by disposing the outer leads, so that the four sides of the gold fingers can be plated with gold, thereby improving the corrosion resistance of the gold fingers. In the present disclosure, the guide lines are connected by the outer leads, so that all the gold fingers of the photovoltaic plate are electrically connected. The soldermask coating in the step 2) means performing soldermask coating on areas outside the outer lead. The plating gold on the gold finger in the step 3) means plating gold on the gold finger only. The etching the outer lead in the step 4) should ensure other parts will not be affected. The soldermask coating in the step 5) means covering the vacancy after etching the outer lead.

Embodiment One

Provided is a method for improving corrosion resistance of a gold finger, which is applicable to an electro-optical circuit board including the gold finger. A guide line is arranged at a root of the gold finger of the electro-optical circuit board as shown in FIG. 1. The method includes following steps in sequence:

1) electrically connecting all the gold fingers of the electro-optical circuit board by using the outer lead, wherein the outer lead is disposed on both sides of the guide line, and a position of the outer lead is disposed 1-10 mm away from the root of the gold finger;

2) performing a first soldermask coating, except for the outer lead, which should be exposed without the soldermask coating covered, wherein single-side windowing is 1-10 mils greater than the width of the outer lead;

3) covering a dry film on an outer surface to only expose the area of the gold fingers;

4) plating gold on the gold finger and removing the dry film in the step 3);

5) covering the dry film on the outer surface again to only expose the outer lead, wherein the single-side windowing is 1-10 mils greater than the width of the outer lead;

6) etching the outer lead and removing the dry film in the step 5); and 7) performing a second soldermask coating on a vacancy after etching the outer lead.

The method in the Embodiment One is applicable to an electro-optical circuit board of a normal type. If plated-through holes are made in the area of the gold fingers of the electro-optical circuit board, and inner leads are disposed in the plated-through holes, then part of the adjacent gold fingers are connected by the inner lead, while the other adjacent gold fingers are connected by the outer lead.

In the Embodiment One, the outer leads are designed at two sides of the guide lines, the outer leads are designed at two sides of the guide lines, and the leads do not have to be removed at the front end, therefore the deficiency of the remnant leads of the gold fingers can be remedied to improve the quality.

In the Embodiment One, the first soldermask coating in the step 2) is performed by super-roughening pre-processing to reduce the risk of falling off of the solder mask.

What described above is the preferred embodiment of the present disclosure, and it is not intended to limit the scope of the present disclosure. All immaterial modifications and substitutions made by those skilled in the art are within the scope of the present disclosure.

What is claimed is:

1. A method for improving corrosion resistance of gold fingers of an electro-optical circuit board, wherein the electro-optical circuit board includes plated-through holes proximate to the gold fingers, and wherein each of the gold fingers includes a guide line having two sides and is arranged at a root of each of the gold fingers, the method comprising:
   electrically connecting the gold fingers using an outer lead disposed on the two sides of the guide line or an inner lead disposed in the plated-through holes;
   soldermask coating a first area outside the outer lead on the electro-optical circuit board;
   soldermask coating and developing a second area proximate the outer lead to expose the outer lead, so that the outer lead is not covered by soldermask;
   plating gold on the gold fingers;
   etching the outer lead; and
   soldermask coating on a vacancy formed after etching the outer lead.

2. The method according to claim 1, wherein adjacent gold fingers are electrically connected by the outer lead or the inner lead.

3. The method according to claim 1, wherein the outer lead is disposed 1-10 mm away from one of the roots of the gold fingers.

4. The method according to claim 1, wherein the second area uncovered by the solder mask is 1 to 10 mils greater than a width of the outer lead.

5. The method according to claim 1, wherein the step of plating gold on the gold fingers includes:
   covering a dry film on an outer surface to only expose the gold fingers;
   plating gold on the gold fingers; and
   removing the dry film.

6. The method according to claim 1, wherein the step of plating gold on the gold fingers is performed with a current density of 3-5 amperes square feet (ASF).

7. The method according to claim 1, wherein the step of etching the outer lead includes:
   covering a dry film on an outer surface, wherein the outer lead is not covered by the dry film;
   etching the outer lead; and
   removing the dry film.

\* \* \* \* \*